United States Patent [19]

Nakato et al.

[11] Patent Number: 5,436,175
[45] Date of Patent: Jul. 25, 1995

[54] SHALLOW SIMOX PROCESSING METHOD USING MOLECULAR ION IMPLANTATION

[75] Inventors: Tatsuo Nakato, Vancouver, Wash.; Narayanan Meyyappan, Woburn, Mass.

[73] Assignees: Sharp Microelectronics Technology, Inc., Camas, Wash.; Sharp Kabushiki Kaisha, Osaka, Japan

[21] Appl. No.: 281,821

[22] Filed: Jul. 27, 1994

Related U.S. Application Data

[63] Continuation-in-part of Ser. No. 131,999, Oct. 4, 1993, abandoned.

[51] Int. Cl.6 .................................. H01L 21/76
[52] U.S. Cl. ................................ 437/24; 437/62
[58] Field of Search ............... 437/24, 26, 62, 938; 148/DIG. 85, DIG. 86

[56] References Cited

U.S. PATENT DOCUMENTS

| | | | |
|---|---|---|---|
| 4,317,686 | 3/1982 | Anand et al. | |
| 4,676,841 | 6/1987 | Celler | 437/24 |
| 4,740,481 | 4/1988 | Wilson et al. | 437/24 |
| 4,810,664 | 3/1989 | Kamins et al. | |
| 4,837,172 | 6/1989 | Mizuno et al. | 437/11 |
| 4,975,126 | 12/1990 | Margail et al. | 145/33.2 |
| 5,047,356 | 9/1991 | Li et al. | 437/21 |
| 5,080,730 | 1/1992 | Wittkower | 148/33 |
| 5,143,858 | 9/1992 | Tomozane et al. | 437/24 |
| 5,196,355 | 3/1993 | Wittkower | 437/24 |

FOREIGN PATENT DOCUMENTS

| | | |
|---|---|---|
| 55-162235 | 12/1980 | Japan . |
| 58-54638 | 3/1983 | Japan . |
| 61-142755 | 6/1986 | Japan . |

OTHER PUBLICATIONS

Lam, H., et al., "Silicon On Insulator by Oxygen Ion Implantation"—Journal of Crystal Growth, 63, (1983), pp. 554–558.

Ishikawa, Y., et al., "Preparation of Thin . . . Oxygen Ion Implantation", Jap. J. Appl. Phys., vol. 30(10), Oct. 1991, pp. 2427–2431.

*Primary Examiner*—George Fourson
*Attorney, Agent, or Firm*—David C. Ripma

[57] ABSTRACT

The invention provides a method of forming shallow SIMOX (Separation by IMplantation of OXygen) substrates by implantation of molecular oxygen ions ($O_2+$), instead of implanting atomic oxygen ions ($O+$) as is done in prior art SIMOX processes. Use of molecular oxygen ions ($O_2+$) doubles the yield of oxygen atoms implanted for each unit of electric charge deposited in the wafer. The resultant structure, after annealing, has a defect density which is not substantially different from SIMOX processing using atomic oxygen ions ($O+$). An alternative method for implanting molecular nitrogen ions is also disclosed.

6 Claims, 1 Drawing Sheet

SHALLOW SIMOX PROCESSING METHOD USING MOLECULAR ION IMPLANTATION

This application is a continuation-in-part of application Ser. No. 08/131,999, filed Oct. 4, 1993, now abandoned, entitled "SIMOX Processing Method Using Molecular Ion Implantation," invented by Tatsuo Nakato.

BACKGROUND AND SUMMARY OF THE INVENTION

The invention relates generally to methods of fabricating semiconductor devices on silicon wafers, and more particularly to a method of forming a shallow buried insulating layer by implanting molecular ions into a silicon substrate.

Ion implantation is a known technique for processing semiconductor wafers. Particles of material to be implanted are accelerated to high energies and enter the body of a semiconductor wafer, coming to rest at a predictable depth. One use of ion implantation is to form a buried insulation layer within the body of a silicon wafer to electrically isolate a surface layer of silicon, where semiconductor devices are fabricated, from the bulk portion of the wafer beneath the insulation layer.

SIMOX (Separation by IMplanted OXygen) is an ion implantation process in which oxygen ions are implanted into a monocrystalline silicon substrate to form a buried layer of silicon dioxide ($SiO_2$). The silicon dioxide serves as an insulation layer in the resulting device. A typical SIMOX fabrication process implants atomic oxygen ions ($O+$) in a substrate using a selected implant energy which can vary between 20 keV to 900 keV, depending on the implantation depth desired. After the atomic oxygen ions ($O+$) are implanted, the substrate is annealed at a temperature of between 1150° C. to 1400° C. Annealing helps distribute the implanted oxygen ions among neighboring silicon atoms, which tends to sharpen the demarcation between the layers. It also helps repair any damage to the superficial silicon layer caused by the implantation process. The implanted oxygen ions bond with the silicon in the substrate to form a buried layer of silicon dioxide ($SiO_2$).

SIMOX is a costly and time-consuming process requiring up to approximately twelve hours to implant the oxygen ions, followed by an annealing process which typically takes 6 hours or more. Nevertheless, because SIMOX produces wafers with useful characteristics it remains the subject of ongoing research.

One area of SIMOX research is the implantation of molecular oxygen ions ($O_2+$) into the silicon substrate, instead of atomic oxygen ions ($O+$). Implantation of molecular oxygen ions ($O_2+$) has the advantage of doubling the oxygen dose for each electrical charge implanted. It also theoretically reduces the implant time, for a given ion beam current, to half the time required to implant individual atomic oxygen ions ($O+$). However, the implantation of molecular oxygen ions ($O_2+$) has not heretofore been successfully implemented, in part, because prior art processing methodologies caused heavy damage to the superficial silicon, and excessive sputtering. See Ishikawa and Shibata, "Preparation of Thin Silicon-on-Insulator Films by Low Energy Oxygen Ion Implantation," Japanese Journal of Applied Physics, Vol. 30, No. 10, October, 1991, p. 2430. According to Ishikawa et al, implantation of molecular oxygen ions ($O_2+$) inflicted great damage to the silicon crystal and resulted in a poor implantation profile due to the reduced projection range of molecular oxygen ions ($O_2+$). It also produced an excessive sputtering yield, three times as large as for atomic ion implantation.

Greater success in implanting molecular oxygen ions was reported by Lam and Pinizzotto in "Silicon-On-Insulator By Oxygen Ion Implantation," Journal of Crystal Growth, Vol. 63, 1993, pp. 554–558. Lam et al. reported success in implanting molecular oxygen ions in a silicon substrate using a beam energy of 300 keV and a dose of $1.3 \times 10^{18}$ molecular ions/cm$^2$. The process produced a buried layer of silicon dioxide approximately 5,000 Å thick. While such results demonstrate the feasibility of conventional SIMOX processing using molecular oxygen ions accelerated to high beam energies, there remains a need for improved techniques suitable for the manufacture of shallow SIMOX wafers.

Shallow SIMOX is a variation of conventional SIMOX processing in which the surface silicon and buried insulation layers are made as thin as practicable. The shallow SIMOX process is of increasing importance in fabricating certain highly efficient switching devices such as fully depleted FETs ("Field Effect Transistors"). Fully depleted FETs have a shallow channel region which becomes fully depleted of electrons (assuming N-type conductivity) and develops low-resistance inverse conductivity with a small change in the gate voltage. The shallow channel region is produced by fabricating the device on a wafer with a thin layer of superficial silicon overlying the buried oxide. Shallow SIMOX preferably has an insulating layer which is buried less than 1,000 Å beneath the surface of the substrate, leaving a thin surface layer of monocrystalline silicon in which active devices are formed. It is possible to prepare conventional SIMOX wafers for use in manufacturing fully depleted devices by thinning the surface layer after conventional SIMOX processing. The thinning step adds expense to an already expensive process, however. It would be far better to prepare shallow SIMOX wafers by directly implanting the insulating layer to a shallow depth.

Ion implantation to produce a buried insulating layer in silicon can alternatively use nitrogen, or another insulating material, instead of oxygen. To implant atomic nitrogen ions ($N+$) in a silicon substrate generally requires approximately the same implant energy and implant dose as is used to implant atomic oxygen ions in the SIMOX process. Following nitrogen implantation, the substrate is annealed in accordance with the SIMOX process. The result is a buried insulating layer of silicon nitride ($Si_3N_4$) in the silicon substrate. The process of nitrogen implantation to insulate surface and supporting layers of silicon from one another is often referred to by the name SIMNI.

Still another prior art implantation technique for forming a buried insulating layer in a silicon substrate uses a combination of oxygen ions and nitrogen ions to form a buried layer of siliconoxynitride ($Si_xN_yO_z$). The process is similar to SIMOX except that both oxygen and nitrogen ions are implanted in the substrate. It is referred to by the name SIMON.

Regardless of whether oxygen or nitrogen is implanted to form an insulating layer in a silicon wafer, the preferred prior art methodology has been to implant atomic ions rather than molecular ions. In particular, molecular ion implantation has not heretofore been used to create shallow SIMOX wafers.

It would be advantageous to provide an improved method of forming a buried insulation layer in silicon by implanting molecular ions instead of atomic ions, thereby increasing the yield of implanted material for each implantation which occurs.

It would also be advantageous to reduce the total electrical charge deposited on a silicon wafer when forming a buried insulation layer using ion implantation.

It would also be advantageous to provide a SIMOX methodology for molecular ion implantation which overcomes the disadvantages of prior art molecular ion implantation techniques.

It would also be advantageous to provide an implantation technique for producing shallow SIMOX wafers wherein molecular ions are implanted to shallow depths within a substrate, thereby reducing or eliminating subsequent processing to thin the surface layer of silicon when fabricating fully depleted active devices.

Accordingly, the present invention provides a method of producing an insulating layer in a silicon substrate using molecular ion implantation. Steps in the method of the invention include (a) providing a source of molecular ions of an insulating material; (b) forming a molecular ion beam from ions provided in step (a), the ion beam having an implantation energy in the range of about 40 keV to 120 keV; (c) implanting molecular ions into a silicon substrate through a first surface of the substrate using the ion beam; and (d) annealing the substrate. The result is a semiconductor substrate with a buried layer of insulating material.

In its preferred form, the invention provides a method of producing a shallow SIMOX substrate with a surface layer of monocrystalline silicon that is less than 1,000 Å thick. Molecular ions of oxygen, nitrogen, or another suitable insulating material, are implanted at an energy of between 40 keV and 120 keV, the energy being selected to cause the implanted molecular ions to come to rest within the substrate in a distribution pattern centered at a depth of less than 1,000 Å beneath the first surface of the substrate. The dose of implanted molecular ions is preferably in the range of about $0.6 \times 10^{17}$ to $2.5 \times 10^{17}$ molecular ions/cm$^2$. The result is a buried layer of insulating material which is itself less than 1,000 Å in thickness. The implantation step is preferably carried out with the substrate at an ambient temperature of between about 450° C. to 800° C. The final annealing step is preferably carried out at a temperature generally in the range of about 1,100° C. to 1,400° C. in an ambient atmosphere which is predominately nitrogen or argon.

The present invention provides a practical methodology for creating shallow SIMOX wafers using molecular ion implantation.

DETAILED DESCRIPTION OF THE PREFERRED EMBODIMENT

Figure 1:
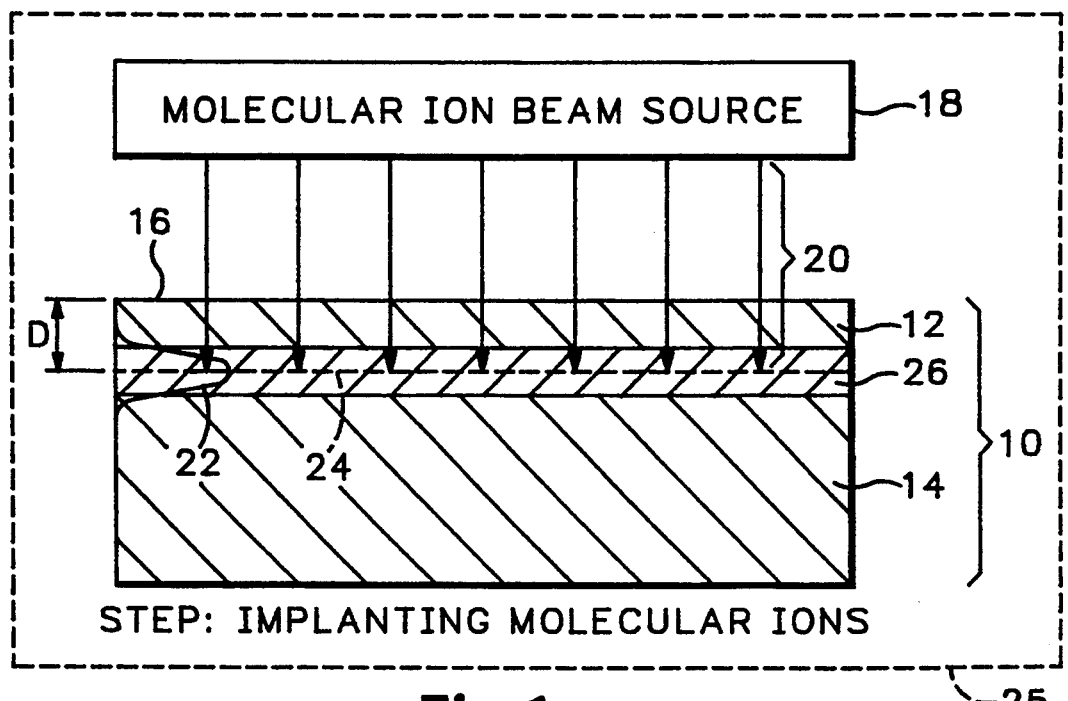
FIG. 1 is a partial cross-sectional schematic view of a silicon substrate during certain processing steps in accordance with the present invention, including the step of implanting molecular ions into the substrate.

Referring to FIG. 1, the method of the present invention implants molecular oxygen ions or molecular nitrogen ions in a monocrystalline silicon substrate 10 to form a buried layer of insulating material in the substrate. The insulating layer serves to electrically isolate active devices (not shown) which are formed in the surface region 12 of the substrate, above the implanted layer, from the bulk supporting layer of silicon 14, below the implanted layer. Surface region 12 is also referred to as the superficial silicon layer 12. The invention will first be described as a SIMOX (Separation by IMplanted OXygen) technique for implanting oxygen into the substrate, and then as an alternative process for implanting nitrogen into the substrate.

An initial step in the method of the present invention is to provide a silicon substrate into which molecular ions of an insulating material are implanted. Referring to FIG. 1, a semiconductor substrate 10 is preferably a wafer of monocrystalline silicon having a crystal orientation of (100). Substrate 10 has a first or upper surface 16 through which ions are implanted into the body of the substrate during the implantation step (described below).

Another step in the method is to provide a suitable source 18 of molecular oxygen ions, or molecular ions of another suitable insulating material, for implantation into substrate 10. One such source of molecular ions 18 for this purpose is an Electron Cyclotron Resonance ("ECR") plasma source, which has been found capable of producing the necessary quantities of molecular oxygen ($O_2+$) for use in an implantation beam. An alternative source for molecular oxygen is a magnetron microwave source. The molecular ion source 18 yields an ion beam illustrated schematically at 20. Beam 20 is used to implant a preferred dose of molecular ions, in the range of about $0.6 \times 10^{17}$ to about $2.5 \times 10^{17}$ molecular ions/cm$^2$, preferably within approximately two hours or less. The method of the present invention does not depend on the type of ion source used and any suitable source 18 may be used.

The beam energy of molecular ion beam 20 is preferably in the range of about 40 keV to 120 keV. Together with the mass of the implanted ions, the selection of the beam energy determines the depth D at which the implanted molecular ions come to rest within substrate 10. As is well known in the art, implanted ions will come to rest in a Gaussian distribution pattern within the substrate, as indicated in FIG. 1 by curve 22. The center of the distribution pattern where the implanted ions come to rest is indicated by dashed line 24. In the present invention the average depth D, at the center of the distribution pattern 22, is preferably less than 1,000 Å beneath the first surface 16 of substrate 10, through which the ion beam is directed.

The selected range of implantation energies used in the method of the present invention has been found suitable for the creation of a shallow-buried dielectric layer in substrate 10. Higher implantation energies, used in certain prior art molecular implantation processes, bury the insulating layer more deeply in the substrate, too deep to permit practical fabrication of fully depleted FETs and similar devices in the top silicon layer 12. Implantation to greater depths using higher beam energies also tends to spread out the distribution pattern of implanted ions, requiring substantial increases in the implant dose, beyond the limits contemplated by this invention. Implanted oxygen, whether atoms or molecules, must reach a critical concentration within a region of the wafer in order for the oxygen to coalesce with the silicon atoms and form silicon dioxide. As the implantation depth increases, the implant dose must also rise to overcome the scattering effect caused by deeper penetration of the ions. In the present invention, shallow penetration implantation is used to create a relatively narrow implanted layer which has a sufficient concentration of ions to produce the desired insulating layer. As noted above, the beam energy of ion beam 20 is in the range of about 40 keV to 120 keV, and is preferably in the range of about 60 keV to 90 keV.

During the molecular ion implantation process illustrated in FIG. 1, an ambient temperature in the range of about 450° C. to 800° C. is maintained around substrate 10. The processing chamber where the ion implantation is performed, illustrated schematically at 25 in FIG. 1, is heated to provide the desired ambient temperature. As is well known, the kinetic effects of implantation will raise the temperature of the target substrate without external heating. However, because the present invention uses relatively low beam energies in creating a shallow SIMOX substrate, kinetic heating is insufficient to heat the substrate to the optimal heat range. It has been found that heating the substrate during implantation improves the quality of the superficial silicon layer 12 in the final wafer.

Figure 2:
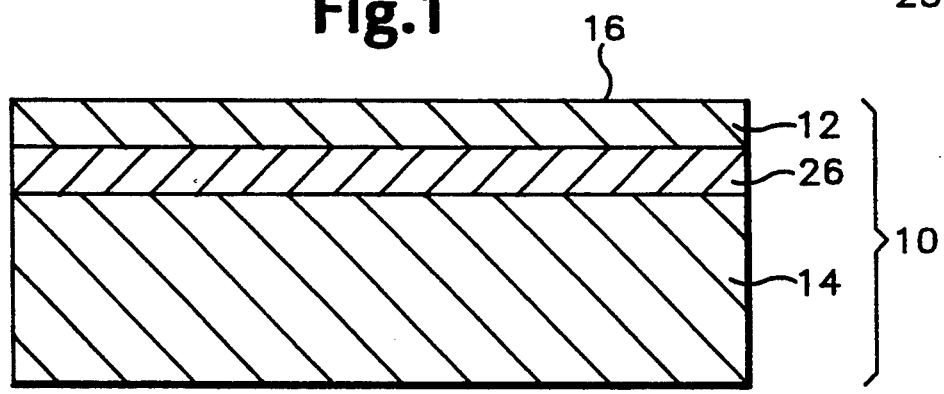
FIG. 2 is a cross-section view of the silicon substrate of FIG. 1 illustrating the buried layer of implanted molecules which results from the implantation step, and also illustrating the annealing step.

The result of the implantation step of FIG. 1 is the formation of an implant region or layer 26 of implanted molecular oxygen ions within the substrate, as shown in FIGS. 1 and 2. The average depth of the implanted layer 26 is the center of the implant distribution pattern, at depth D as shown in FIG. 1.

Figure 3:
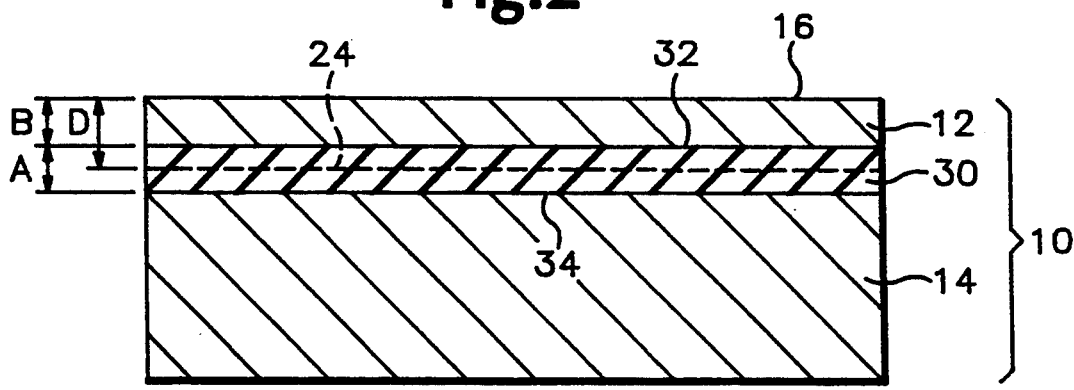
FIG. 3 is a view of the substrate as in FIGS. 1 and 2 showing the resultant structure.

The next step in the process, illustrated in FIG. 2, is to anneal the structure which results from the implantation step. That structure includes a thin upper silicon layer 12, an intermediate layer 26 of implanted molecular oxygen ions, and a bottom layer 14 of silicon, which forms the supporting bulk of substrate 10. Annealing is carried out in the same manner as in conventional SIMOX processing using a suitable annealing chamber. With the substrate surrounded by an atmosphere formed predominantly of one of the following selected gasses: nitrogen or argon, and containing perhaps 0.25% oxygen, the ambient temperature is raised to a suitable annealing temperature, generally in the range of 1100° C. to 1400° C. During the annealing process the implanted oxygen reacts with the silicon of wafer 10, resulting in the formation of a layer of silicon dioxide 30, as illustrated in FIG. 3. Annealing re-crystallizes and repairs the superficial silicon layer 12, which is usually damaged by the ion implantation process. It also redistributes the implanted oxygen as it chemically bonds with the silicon to form a silicon dioxide (SiO2) layer 30, causing the sharpening of the boundaries 32, 34 between layers 12, 14 and 30 (FIG. 3).

The duration of the annealing step of FIG. 2 is dependent to some degree on the desired characteristics of the resultant structure. Annealing times can range from 0.1 hour to 12 hours, depending on the implantation dose, implantation energy and the number and kinds of defects that are acceptable in the superficial silicon layer 12 and the dielectric layer 30. The preferred temperature for the annealing step illustrated in FIG. 2 is approximately 1300° C. and the annealing step is preferably carried out for approximately six hours.

The structure which results from the above-described process is shown in FIG. 3. A buried layer of silicon dioxide 30 is formed in silicon substrate 10. The silicon dioxide layer which results from the implantation of molecular oxygen ions ($O_2+$) has been found to be comparable to a layer formed by implantation of atomic oxygen ions ($O+$). In particular, there appears to be no substantial difference in the overall defect densities between implanted atomic oxygen ions ($O+$) and implanted molecular oxygen ions ($O_2+$) if the process of the present invention is employed. Use of molecular oxygen implantation produces SIMOX substrates of commercial quality. The sputtering yield during molecular ion implantation has been found to be comparable (i.e., not noticeably greater than) sputtering yields during atomic ion implantation.

Shallow SIMOX substrate 10, as shown in FIG. 3, includes an implanted silicon dioxide layer 30 formed at an average depth D beneath first or upper surface 16 of substrate 10. Depth D, which is the approximate centerline 24 extending through layer 30, is less than 1,000 Å beneath first surface 16. The thickness of buried insulating layer 30, indicated at A in FIG. 3, will also preferably be less than 1,000 Å and ideally less than 700 Å. Similarly, the thickness of the superficial silicon layer 25 indicated at B in FIG. 3, is less than 1,000 Å and preferably less than 850 Å.

EXAMPLE

In this example, a monocrystalline silicon wafer is implanted with a buried oxide layer using a beam of molecular oxygen ions ($O_2+$) directed at the first surface 16 of a silicon substrate 10. A beam energy of 60 keV is used in the implantation of molecular ions, the beam current being 4.4 mA. The implantation of $O_2+$ ions is carried out for a period of one hour at an ambient temperature of 550° C. The implant dose is $1.1 \times 10^{17}$ molecules/cm$^2$. Following the implantation step, the wafer is placed in an annealing atmosphere of predominantly nitrogen gas, with approximately 0.25% oxygen. The annealing step is carried out at 1300° C. for 6 hours.

The resultant structure has a superficial layer of silicon which is 498 Å thick (dimension B in FIG. 3); the buried layer of silicon dioxide has a thickness (dimension A) of 439 Å. The average depth D of insulating layer 30 is approximately 720 Å. The breakdown voltage across the silicon dioxide layer 30 averages 23.0 volts @1 μA. The defect density of the superficial silicon layer is $6.0 \times 10^3$/cm$^2$.

The above-described process can alternatively be used to produce a buried insulating layer of silicon nitride ($Si_3N_4$) using an ion beam of molecular nitrogen ions ($N_2+$). The steps in the above-described method are followed, except that molecular nitrogen ions ($N_2+$) are used in the implantation step, instead of molecular oxygen ions ($O_2+$). Because of the slightly lower atomic weight of nitrogen, the molecular nitrogen ions will tend to penetrate further into the silicon substrate, if the same beam energy is employed, and will form an insulating layer somewhat deeper in the substrate than where molecular oxygen ions are implanted. Otherwise, the method of the present invention can be carried out in the same manner for either nitrogen or oxygen.

Regardless of whether molecular oxygen ions or molecular nitrogen ions are implanted in accordance with the present method, the beam energy should be selected to implant the molecular ions to an average depth of less than 1,000 Å beneath the top surface 16 of the substrate. The dose, beam current and other process factors used in the above example can be used with either molecular oxygen ions or molecular nitrogen ions. As indicated above, if molecular nitrogen ions are used, the depth of penetration will be slightly greater, but will not exceed 1,000 Å average depth.

Another alternative methodology in accordance with the present invention is the implantation of both molecular oxygen and molecular nitrogen to form a buried insulation layer of siliconoxinitride ($Si_xN_yO_z$). In such a hybrid process, the implantation energies of the molecular oxygen ion beam and molecular nitrogen ion beam are adjusted to equalize the average depth of penetration D for each element. Otherwise, the methodology described with reference to FIGS. 1-3 is followed. Other alternative embodiments of the present invention will occur to those skilled in the art.

The present invention provides a suitable methodology for shallow SIMOX or shallow SIMON processing using molecular ion implantation. The invention minimizes the defect density and sputtering problems associated with attempts at conventional SIMOX processing, using higher energies and implanting to greater depths, with molecular ions. The dose and energy ranges specified provide a substrate suitable for the formation of fully depleted FETs in the surface layer. As such, the invention opens the way to commercial use of the SIMOX methodology.

What is claimed is:

1. In a silicon substrate, a method of producing a shallow-buried dielectric layer beneath a surface layer of monocrystalline silicon in which semiconductor devices are formed, the method comprising the following steps:
   (a) providing an ion implantation beam of molecular ions formed of molecules of an insulating element selected from the following: (1) oxygen or (2) nitrogen;
   (b) using the molecular ion implantation beam provided in step (a), directing an implant dose of the selected molecular ions in the range of about $0.6 \times 10^{17}$ to $2.5 \times 10^{17}$ molecular ions/cm² through a first surface of a monocrystalline silicon substrate with an implantation energy in the range of about 60 KeV to 90 KeV to produce an implanted layer of the selected insulating element within the substrate having a peak concentration less than 1000 Å beneath the first surface of the substrate;
   (c) annealing the substrate to cause the implanted selected insulating element to react with the silicon of the substrate and form a layer of buried dielectric material having a thickness of less than 1000 Å beneath a surface layer of monocrystalline silicon having a thickness of less than 1000 Å.

2. The method of claim 1 in which the insulating element selected in step (a) to provide the ion implantation beam of molecular ions is oxygen and the layer of buried insulating material formed as a result of annealing step (c) is silicon dioxide ($SiO_2$).

3. The method of claim 1 in which, during the implanting step (b), the substrate is heated to an ambient temperature in the range of about 450° C. to 800° C.

4. The method of claim 1 in which the insulating element selected in step (a) to provide the ion implantation beam of molecular ions is nitrogen and the layer of buried insulating material formed as a result of annealing step (c) is silicon nitride ($Si_3N_4$).

5. The method of claim 1 in which step (c) includes annealing the substrate at a temperature of about 1300° C. in an ambient atmosphere which is predominately one of the following gasses: nitrogen and argon.

6. A method of forming a shallow SIMOX substrate having a buried insulating layer with a thickness of less than 1000 Å and having a superficial layer of monocrystalline silicon less than 1000 Å thick in which semiconductor devices are formed, the method comprising:
   (a) providing a silicon substrate having a first surface;
   (b) forming a beam of molecular oxygen ions having an implantation energy in the range of about 60 KeV to 90 KeV;
   (c) providing an ambient temperature for the silicon substrate in the range of about 450° C. to 800° C.;
   (d) using the beam provided in step (b), implanting a dose of molecular oxygen ions into the silicon substrate through said first surface, the implant dose being in the range of about $0.6 \times 10^{17}$ to $2.5 \times 10^{17}$ molecular oxygen ions/cm², to produce an implanted layer of oxygen within the substrate having a peak concentration less than 1000 Å beneath the first surface of the substrate; and
   (e) annealing the substrate at a temperature of about 1300° C. in an ambient atmosphere which is predominately one of the following gasses: nitrogen and argon, to cause the implanted oxygen to react with the silicon of the substrate and form a layer of silicon dioxide ($SiO_2$) having a thickness of less than 1000 Å beneath a surface layer of monocrystalline silicon having a thickness of less than 1000 Å, thereby forming a shallow SIMOX substrate.

* * * * *